US012704787B2

(12) United States Patent
Kot

(10) Patent No.: US 12,704,787 B2
(45) Date of Patent: Aug. 11, 2026

(54) SINGLE-CELL SCATTEROMETRY OVERLAY WITH SENSITIVITY CALIBRATION

(71) Applicant: KLA Corporation, Milpitas, CA (US)

(72) Inventor: Mordechy Kot, Migdal Haemek (IL)

(73) Assignee: KLA Corporation, Milpitas, CA (US)

( * ) Notice: Subject to any disclaimer, the term of this patent is extended or adjusted under 35 U.S.C. 154(b) by 172 days.

(21) Appl. No.: 17/987,580

(22) Filed: Nov. 15, 2022

(65) Prior Publication Data

US 2024/0160114 A1 May 16, 2024

(51) Int. Cl.
*G03F 7/00* (2006.01)

(52) U.S. Cl.
CPC ...... *G03F 7/70633* (2013.01); *G03F 7/70683* (2013.01); *G03F 7/706845* (2023.05)

(58) Field of Classification Search
CPC .................................................. G03F 7/70633
See application file for complete search history.

(56) References Cited

U.S. PATENT DOCUMENTS 7,317,531 B2 1/2008 Mieher et al.
10,197,389 B2 2/2019 Levinski et al.
2010/0328655 A1* 12/2010 Den Boef ........ G01N 21/95607 356/237.5
2013/0208279 A1* 8/2013 Smith .................... G01B 11/26 356/401
2014/0136137 A1 5/2014 Tarshish-Shapir et al.
2014/0212817 A1* 7/2014 Habets ................ G03F 7/70633 430/319
2018/0129139 A1 5/2018 Jiang et al.
2018/0341182 A1* 11/2018 Sanguinetti ......... G03F 7/70133
2018/0373167 A1 12/2018 Grunzweig et al.
2020/0033741 A1 1/2020 Van Der Schaar et al.
2020/0381312 A1* 12/2020 Lamhot ............. H01L 21/67259

FOREIGN PATENT DOCUMENTS

WO 2017044283 A1 3/2017
WO 2020106335 A1 5/2020

OTHER PUBLICATIONS

Adel, et al., "Diffraction order control in overlay metrology—a review of the roadmap options," Proc. of SPIE vol. 6922, 692202-1 (2008).
Korean Intellectual Property Office, International Search Report and Written Opinion received in International Application No. PCT/US2023/036980, Mar. 6, 2024, 9 pages.

* cited by examiner

*Primary Examiner* — Steven H Whitesell
(74) *Attorney, Agent, or Firm* — Suiter Swantz IP

(57) ABSTRACT

A metrology system may receive metrology data for a first set of overlay targets including at least two cells with different intended offsets. The system may further receive metrology data for a second set of overlay targets, where the metrology data for the second set of overlay targets is based on fewer cells than for the first set of overlay targets. The system may further generate sensitivity metrics at locations of the first set of overlay targets based on the metrology data for the first set of overlay targets, generate overlay measurements for the first set of overlay targets based on the sensitivity metrics and the metrology data from the first set of overlay targets, and generate overlay measurements for the first and second sets of overlay targets based on the sensitivity metrics and the metrology data from the second set of overlay targets.

28 Claims, 9 Drawing Sheets

104
204
208
202
X
Y
Z

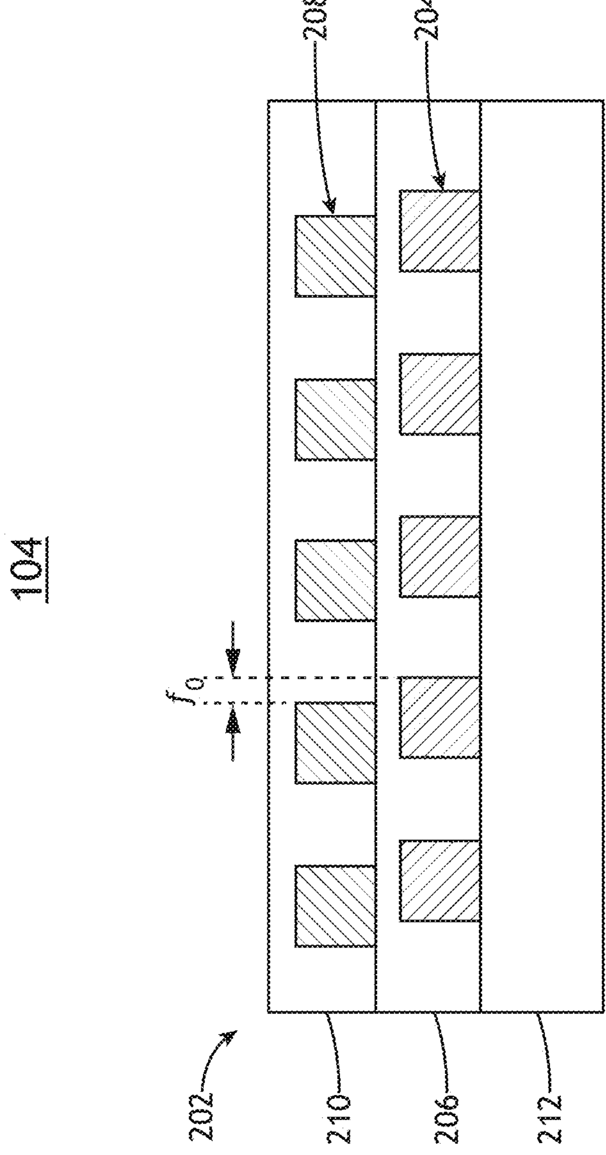
FIG. 2B
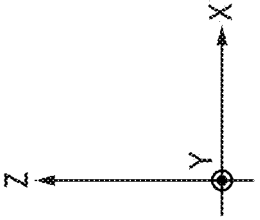

104
$+f_0$
202
$-f_0$ 104
202
$f_0$

104 SAMPLE
132 PUPIL PLANE
202a
202b
+f0
-f0
502
504

SINGLE-CELL SCATTEROMETRY OVERLAY WITH SENSITIVITY CALIBRATION

TECHNICAL FIELD

The present disclosure relates generally to scatterometry overlay metrology and, more particularly, to single-cell scatterometry overlay metrology.

BACKGROUND

Scatterometry overlay metrology techniques typically generate overlay measurements based on data collected from two or more cells of an overlay target, where each cell includes a grating-over-grating structure with a different intentional offset. However, this approach requires alignment of a metrology tool to each required cell, which negatively impacts measurement throughput and may introduce inaccuracies due to navigation calibration errors and/or unintended differences between the cells. Further, such two-cell designs may be relatively large, which may make it impractical to place targets in some areas of a sample (e.g., within dies, or the like) and may further lead to reduced yield. There is therefore a desire to develop systems and methods to cure the above deficiencies.

SUMMARY

A metrology system is disclosed in accordance with one or more illustrative embodiments of the present disclosure. In one illustrative embodiment, the system includes a controller. In another illustrative embodiment, the controller receives metrology data associated with a first set of overlay targets, where each of the first set of overlay targets includes at least two cells with different intended offsets between overlapping features on two layers of the sample. In another illustrative embodiment, the controller receives metrology data associated with a second set of overlay targets, where the metrology data associated with the second set of overlay targets is based on fewer cells than the metrology data associated with the first set of overlay targets. In another illustrative embodiment, the controller generates sensitivity metrics at locations of the first set of overlay targets based on the metrology data for the first set of overlay targets. In another illustrative embodiment, the controller generates overlay measurements for the first set of overlay targets based on the sensitivity metrics and the metrology data from the first set of overlay targets. In another illustrative embodiment, the controller generates overlay measurements for the first and second sets of overlay targets based on the sensitivity metrics and the metrology data from the second set of overlay targets.

A metrology system is disclosed in accordance with one or more illustrative embodiments of the present disclosure. In one illustrative embodiment, the system includes a metrology sub-system to generate metrology data associated with a sample. In another illustrative embodiment, the system includes a controller communicatively coupled with the metrology sub-system. In another illustrative embodiment, the controller receives metrology data associated with a first set of overlay targets, where each of the first set of overlay targets includes at least two cells with different intended offsets between overlapping features on two layers of the sample. In another illustrative embodiment, the controller receives metrology data associated with a second set of overlay targets, where the metrology data associated with the second set of overlay targets is based on fewer cells than the metrology data associated with the first set of overlay targets. In another illustrative embodiment, the controller generates sensitivity metrics at locations of the first set of overlay targets based on the metrology data for the first set of overlay targets. In another illustrative embodiment, the controller generates overlay measurements for the first set of overlay targets based on the sensitivity metrics and the metrology data from the first set of overlay targets. In another illustrative embodiment, the controller generates overlay measurements for the first and second sets of overlay targets based on the sensitivity metrics and the metrology data from the second set of overlay targets.

A method is disclosed in accordance with one or more illustrative embodiments of the present disclosure. In one illustrative embodiment, the method includes generating metrology data associated with a first set of overlay targets and a second set of overlay targets on a sample, where each of the first set of overlay targets includes at least two cells with different intended offsets between overlapping features on two layers of the sample, and where the metrology data associated with the second set of overlay targets is based on fewer cells than the metrology data associated with the first set of overlay targets. In another illustrative embodiment, the method includes generating sensitivity metrics at locations of the first set of overlay targets based on the metrology data for the first set of overlay targets. In another illustrative embodiment, the method includes generating overlay measurements for the first set of overlay targets based on the sensitivity metrics and the metrology data from the first set of overlay targets. In another illustrative embodiment, the method includes generating overlay measurements for the second set of overlay targets based on the sensitivity metrics and the metrology data from the second set of overlay targets.

A sample is disclosed in accordance with one or more illustrative embodiments of the present disclosure. In one illustrative embodiment, the sample includes a plurality of overlay targets distributed across a plurality of fields. In another illustrative embodiment, the plurality of overlay targets comprises a first set of overlay targets, where each of the first set of overlay targets includes at least two cells with different intended offsets between overlapping features on two layers of the sample. In another illustrative embodiment, the plurality of overlay targets further includes a second set of overlay targets, where each of the second set of overlay targets includes fewer cells than the first set of overlay targets. In another illustrative embodiment, metrology data associated with diffraction by the first set of overlay targets provides overlay measurements at locations of the first set of overlay targets. In another illustrative embodiment, metrology data associated with diffraction by the second set of overlay targets and sensitivity metrics from the metrology data associated with the first set of overlay targets provides overlay measurements at locations of the second set of overlay targets.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 2B is a side view of the single cell in FIG. 2A, in accordance with one or more embodiments of the present disclosure.

DETAILED DESCRIPTION

Figure 1A:
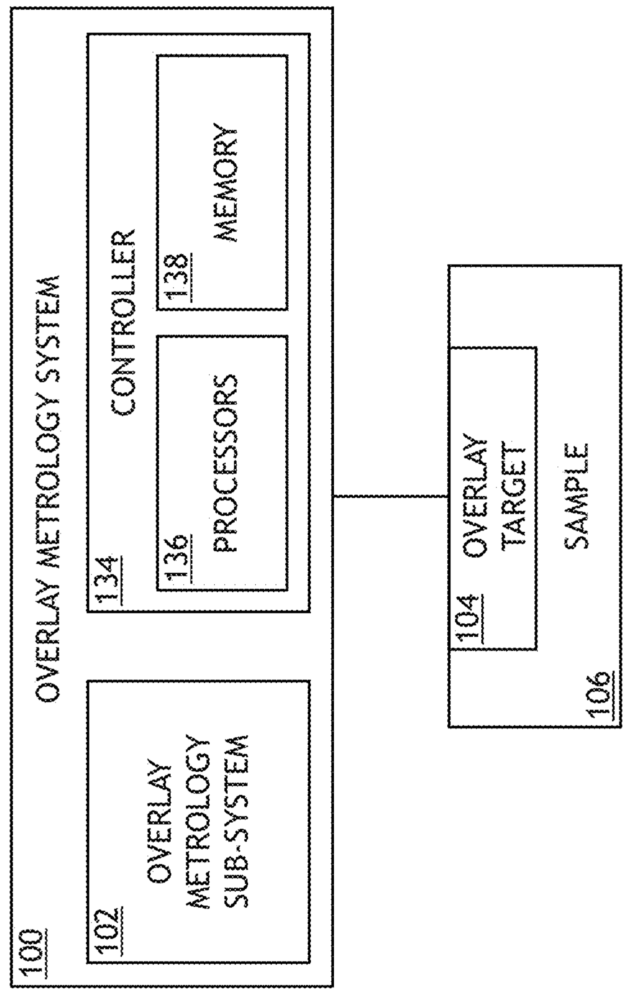
FIG. 1A is a block diagram view of an overlay metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for scatterometry overlay metrology (SCOL) measurements of single-cell overlay targets on a sample based on calibrating the single-cell overlay targets with data from multi-cell overlay targets on the sample.

SCOL techniques may generally utilize overlay targets including two or more cells per direction, where each of the cells includes overlapping features on two or more layers of a sample, and where the cells are fabricated with different intended offsets between the overlapping features. In a general sense, the features associated with each layer are 180-degree rotationally symmetric such that a cell is 180-degree rotationally symmetric when no intended offset is present. In some embodiments, the features of a cell are periodic and may be characterized by at least one pitch or spatial frequency. Such periodic features may thus generate discrete diffraction orders. For example, a cell may include grating structures (or gratings) on each layer of interest, where the overlapping grating structures may be referred to as grating-over-grating structures. However, it is to be understood that features on a particular sample layer may be characterized by multiple pitches along a particular direction and/or by multiple pitches along different directions. For instance, features of a grating-over-grating structure may be segmented to provide multiple pitches in any combination of directions or otherwise distributed to provide spatial frequencies suitable for generating diffraction of incident light. Further, any references to the term "grating-over-grating structure" in the present disclosure are merely illustrative and should not be interpreted as limiting the disclosure. Rather, any such references may be understood to encompass or extend to any suitable 180-degree rotationally symmetric features suitable for SCOL techniques. For example, various examples herein may refer to diffraction orders for illustrative purposes. However, SCOL measurements may be performed on one or more cells including non-periodic overlapping features based on the entire reflected signal (e.g., the entire pupil plane).

SCOL measurements are based on metrology data generated by illuminating a cell and collecting the resulting light from the cell. In the case of grating-over-grating structures, this resulting light may include one or more diffraction orders. As an illustration, first-order SCOL techniques may be based on metrology data associated with first-order diffraction from grating-over-grating structures, where the first-order diffraction may be resolvable in a pupil plane (e.g., as diffraction lobes) and/or in a field plane (e.g., as regions of constant intensity). As another illustration, zero-order SCOL techniques may be based on metrology data associated with zero-order light from an overlay target such as, but not limited to, zero-order diffraction or opposite-order diffraction from overlapping grating-over-grating structures (e.g., positive first-order diffraction from a grating structure in one layer and negative first-order diffraction from a grating structure in another layer). Various non-limiting examples of SCOL techniques are generally described in Adel, et al., "Diffraction order control in overlay metrology—a review of the roadmap options," Proc. Of SPIE Vol. 6922, 692202-1 (2008); U.S. Pat. No. 7,317,531 entitled "Apparatus and methods for detecting overlay errors using scatterometry" and issued on Jan. 8, 2008; U.S. Pat. No. 10,197,389 entitled "Approaches in first order scatterometry overlay based on introduction of auxiliary electromagnetic fields" and issued on Feb. 5, 2019; and International Publication Number WO 2017/044283; all of which are incorporated herein by reference in their entireties.

It is recognized herein that SCOL techniques typically require overlay targets with multiple cells, where each cell has a different intended offset (e.g., intended physical overlay). In such a configuration, the metrology data of the various cells is used to generate a measurement of unintended overlay (e.g., unintended physical overlay) at a location of the overlay target. Different SCOL techniques based on different diffraction orders may generally require different numbers of cells in an overlay target to generate a measurement. Continuing the illustration above, first-order SCOL techniques based on cells with grating-over-grating structures may typically require two-cell overlay targets and generate measurements based on both positive and negative first-order diffraction from each cell.

It is contemplated herein that metrology data collected in SCOL techniques associated with multiple cells of an overlay target may generally be separated into multiple components, where a first set of the components (referred to herein as a K signal) depends on the actual values of overlay at the location of an overlay target while a second set of the components (referred to herein as a G signal) does not. Rather, the G signal depends on physical properties of the overlay target design and relate to a sensitivity of the target to overlay variations. For this reason, this G signal is referred to herein as a sensitivity metric.

It is noted that an SCOL measurement at a particular location on the sample requires both a K signal and a G signal. For example, an overlay measurement (OVL) may be calculated as OVL=KIG. However, since the G signal (e.g., the sensitivity metric) does not depend directly on the actual overlay at a particular location of an overlay target, the G signal may be obtained from another source and thus need not be measured at every overlay target. As a result, the number of cells required for an overlay target to obtain an overlay measurement may be reduced when the G signal is obtained from another source, which may beneficially decrease measurement times and increase measurement throughput across the sample. Continuing the illustration of first-order SCOL techniques, a single-cell overlay target may be used when the G signal is obtained from another source.

In embodiments of the present disclosure, a sample may include a first set of overlay targets designed to provide sensitivity metrics (e.g., G signals) and a second set of overlay targets that do not provide sensitivity metrics. In this way, overlay measurements at locations of the second set of overlay targets may utilize the sensitivity metrics associated with the first set of overlay targets. Metrology data from the first set of overlay targets may provide enough information to generate overlay measurements at the corresponding locations as well. Using this technique, the measurement throughput across a sample may generally increase as the number of the first set of overlay targets is reduced relative to the number of the second set of overlay targets. In some embodiments, similar performance benefits may be obtained by simply reducing a number of measurements for some overlay targets. For example, a sample may include a common overlay target design across a sample that is suitable for providing sensitivity metrics, but these sensitivity metrics are only obtained for a subset of the targets. As an illustration, a sample may include two-cell overlay targets distributed across a sample. In this configuration, measurements from both cells may be performed on a first set of the overlay targets (e.g., a first subset of the common overlay target design) to obtain both overlay measurements and sensitivity metrics at these locations, whereas measurements from one of the cells may be performed on a second set of the overlay targets (e.g., a second subset of the common overlay target design) to obtain overlay measurements based on sensitivity metrics from the first set of overlay targets.

It is further contemplated herein that the sensitivity metrics (e.g., the G signals) relate to physical attributes of the overlay target design. As a result, variations of these sensitivity metrics across a wafer may relate to variations of the physical attributes of the overlay targets across the wafer, which typically occurs over length scales much greater than overlay variations. For example, overlay variations may vary significantly within each lithographic exposure field, whereas the physical attributes of the overlay targets (and thus the sensitivity metrics) may vary relatively slowly across several fields. Sensitivity metrics measured at one location may thus be relevant to multiple targets within a field or potentially between fields.

Sensitivity metrics from the first set of overlay targets may be applied to the second set of overlay targets using any suitable technique such as, but not limited to, a nearest neighbor technique, polynomial fitting, or interpolation.

Referring now to FIGS. 1A-7, systems and methods for efficient SCOL metrology are described in greater detail, in accordance with one or more embodiments of the present disclosure.

FIG. 1A is a block diagram view of an overlay metrology system 100, in accordance with one or more embodiments of the present disclosure.

In embodiments, the overlay metrology system 100 includes an overlay metrology sub-system 102 to generate metrology data from an overlay target 104 on a sample 106. For example, the overlay target 104 may include one or more cells, each including a grating-over-grating structure. The overlay metrology sub-system 102 may be a SCOL metrology sub-system to generate metrology data associated with diffraction orders from the overlay target 104.

Figure 2A:
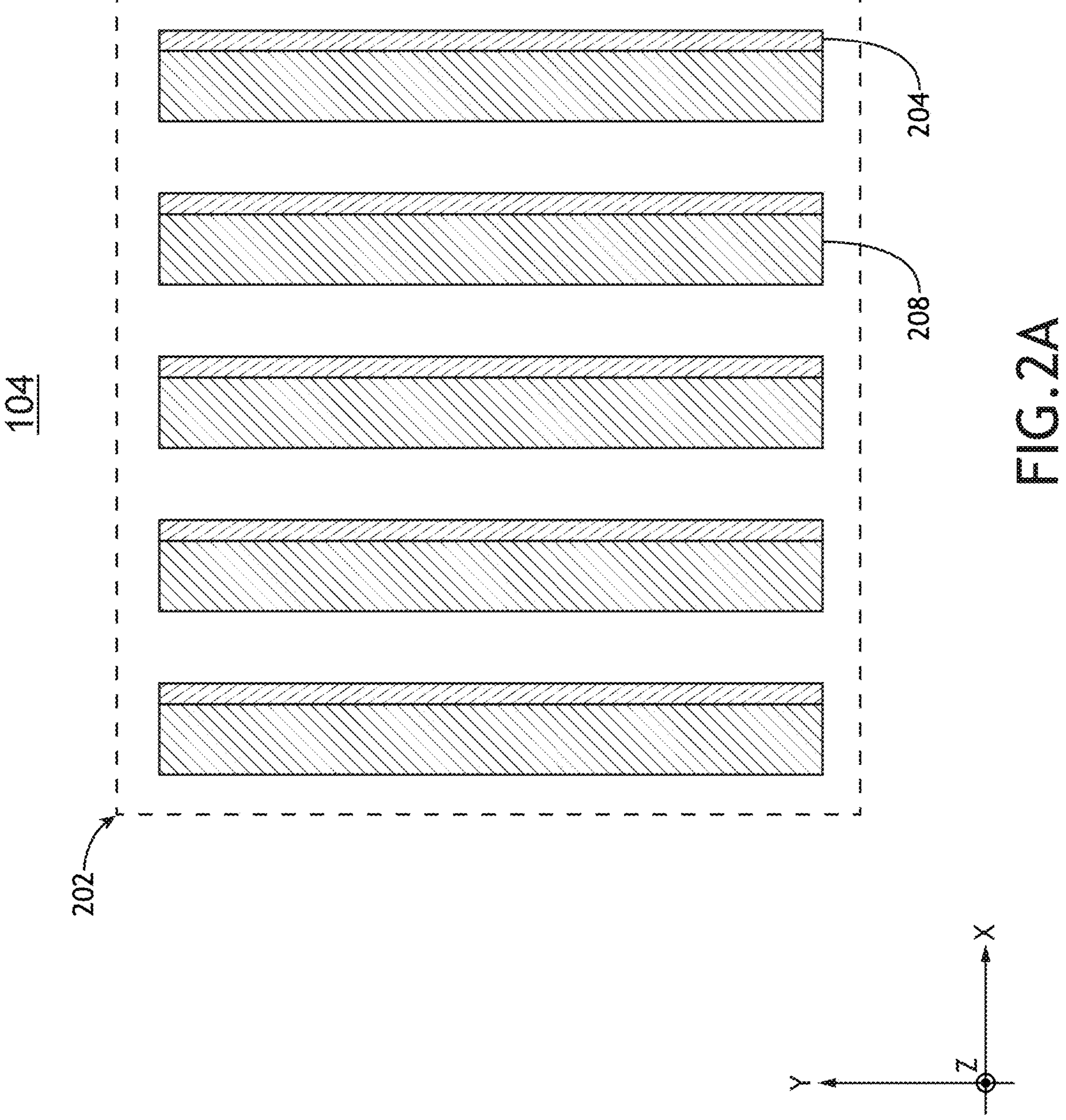
FIG. 2A is a top view of single cell of an overlay target with a grating-over-grating structure, in accordance with one or more embodiments of the present disclosure.

FIGS. 2A-2B depict an overlay target 104 suitable for SCOL metrology techniques, in accordance with one or more embodiments of the present disclosure.

FIG. 2A is a top view of single cell 202 of an overlay target 104 with a grating-over-grating structure, in accordance with one or more embodiments of the present disclosure.

FIG. 2B is a side view of the single cell 202 in FIG. 2A, in accordance with one or more embodiments of the present disclosure.

In one embodiment, the cell 202 includes first-layer printed elements 204 located on a first layer 206 of the sample 106 and second-layer printed elements 208 located on a second layer 210 of the sample 106 oriented such that the regions including the first-layer printed elements 204 and the second-layer printed elements 208 overlap to form a grating-over-grating structure. FIG. 2B further depicts a substrate 212 beneath the first-layer printed elements 204 and the second-layer printed elements 208.

The first-layer printed elements 204 and the second-layer printed elements 208 in any particular cell 202 may be designed to have any intended offset ($f_0$) along any direction (e.g., the X direction in FIG. 2B corresponding to a measurement direction). For example, an intended offset of zero ($f_0=0$) may provide that the first-layer printed elements 204 and the second-layer printed elements 208 fully overlap when the physical overlay is also zero (e.g., no overlay error). In this configuration, a relative shift between the first-layer printed elements 204 and the second-layer printed elements 208 is indicative of overlay error during fabrication. As another example, a non-zero intended offset ($f_0\neq0$) may provide that the first-layer printed elements 204 and the second-layer printed elements 208 exhibit this intended offset when the physical overlay is zero (e.g., no overlay error).

Figures 3A, 3B:
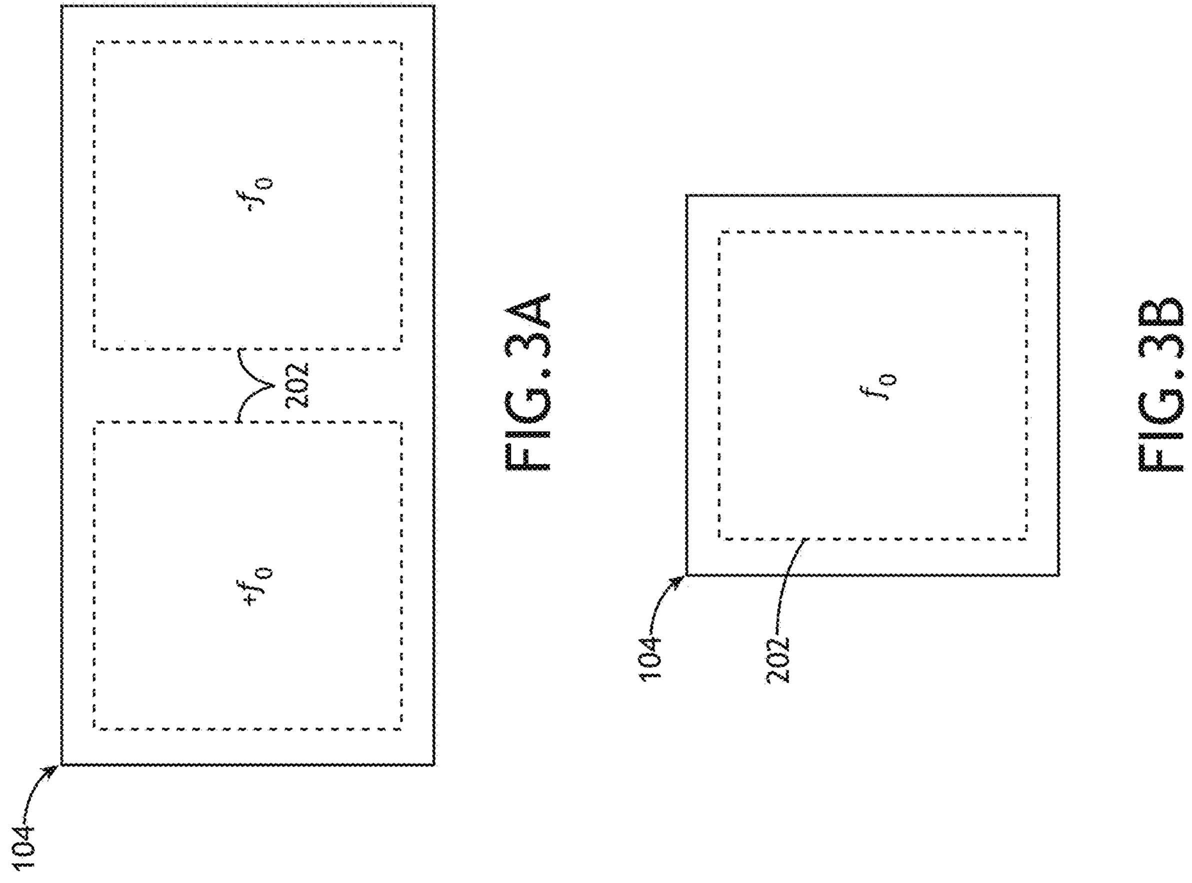
FIG. 3A is a top conceptual view of an overlay target having two cells with equal and opposite non-zero intended offsets, in accordance with one or more embodiments of the present disclosure.
FIG. 3B is a top conceptual view of an overlay target having a single cell, in accordance with one or more embodiments of the present disclosure.

An overlay target 104 may generally be formed from any number of cells 202 that may have any combination of intended offsets (e.g., values of $f_0$). As a non-limiting illustration, FIG. 3A is a top conceptual view of an overlay target 104 having two cells 202 with equal and opposite non-zero intended offsets, in accordance with one or more embodiments of the present disclosure. In particular, a first cell 202 in FIG. 3A has an intended offset of $+f_0$ and a second cell 202 in FIG. 3A has an intended offset of $-f_0$, where $f_0$ may be any non-zero number. As another non-limiting illustration, FIG. 3B is a top conceptual view of an overlay target 104 having a single cell 202, in accordance with one or more embodiments of the present disclosure. In this configuration, the cell 202 may have any intended offset including a zero ($f_0=0$) or a non-zero value ($f_0\neq0$).

Although not explicitly illustrated, an overlay target 104 may be suitable for overlay measurements along multiple directions (e.g., orthogonal directions). In general, a measurement direction may correspond to the direction of periodicity of the first-layer printed elements 204 and the second-layer printed elements 208 (e.g., a direction of periodicity of the grating-over-grating structure). As an illustration, the cell 202 depicted in FIGS. 2A and 2B exhibits periodicity along the X direction and is suitable for overlay measurements along the X direction.

In some embodiments, an overlay target 104 includes one or more cells 202 having periodicity along a first direction (e.g., the X direction as depicted in FIGS. 2A and 2B) and one or more cells having periodicity along a second direction (e.g., the Y direction as depicted in FIGS. 2A and 2B). In some embodiments, an overlay target 104 includes one or more cells 202 having periodicity along two directions simultaneously. For example, the first-layer printed elements 204 and the second-layer printed elements 208 may include structures that are periodic in both the X and Y directions (e.g., a hatch pattern, a grid of square or rectangular structures, or the like).

Referring generally to FIGS. 2A and 2B, it is to be understood that FIGS. 2A and 2B along with the associated descriptions are merely illustrative and should not be interpreted as limiting on the present disclosure. For example, the first layer 206 and the second layer 210 may generally have any thicknesses. As another example, the sample 106 may include any number of layers between the first-layer printed elements 204 and the second-layer printed elements 208 and/or between the first-layer printed elements 204 and the substrate 212. As another example, the first-layer printed elements 204 and the second-layer printed elements 208 may generally include any 180-degree rotationally symmetric features and need not include grating-over-grating or even periodic features.

Figure 1B:
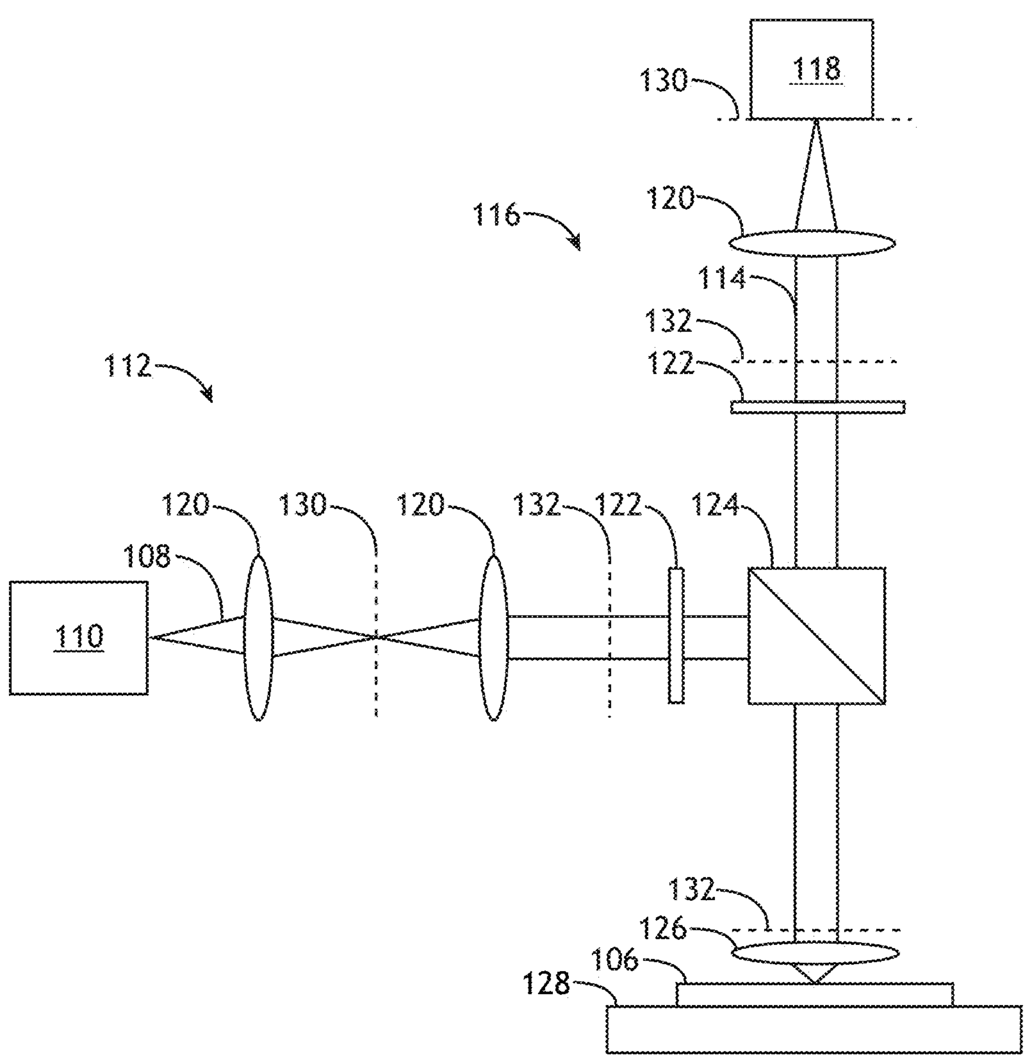
FIG. 1B is a simplified schematic of the overlay metrology sub-system, in accordance with one or more embodiments of the present disclosure.

Referring now to FIG. 1B, various aspects of the overlay metrology sub-system 102 are described in greater detail, in accordance with one or more embodiments of the present disclosure. FIG. 1B is a simplified schematic of the overlay metrology sub-system 102, in accordance with one or more embodiments of the present disclosure.

In embodiments, the overlay metrology sub-system 102, is configurable according to a metrology recipe (e.g., an overlay recipe) to generate an overlay measurement associated with an overlay target 104 having a design based on the metrology recipe. For example, the overlay metrology sub-system 102 may direct an illumination beam 108 from an illumination source 110 to an overlay target 104 on the sample 106 (e.g., via an illumination pathway 112), collect light or other radiation emanating from the overlay target 104 (referred to herein as measurement light 114) via a collection pathway 116, and generate metrology data from at least one detector 118 based on the measurement light 114. For example, metrology data may be associated with diffraction of the illumination beam 108 from the overlay target 104. The illumination pathway 112 and the collection pathway 116 may further include additional optical elements such as, but not limited to, lenses 120 and beam manipulation components 122 (e.g., polarizers, spectral filters, spatial filters, beam blockers, apertures, or the like) at any suitable locations. In some embodiments, as illustrated in FIG. 1B, the overlay metrology sub-system 102 includes one or more beamsplitters 124 to allow simultaneous illumination and collection through a common objective lens 126 or other focusing element. In some embodiments, the overlay metrology sub-system 102 includes a translation stage 128 including any number of linear or rotational actuators to secure and/or position the sample 106.

The overlay metrology sub-system 102 may include one or more detectors 118 at any suitable locations for the collection of metrology data. For example, the overlay metrology sub-system 102 may include at least one detector 118 at a field plane 130 (e.g., a plane conjugate to the sample 106), which is illustrated in FIG. 1B. As another example, though not illustrated, the overlay metrology sub-system 102 may include at least one detector 118 at a pupil plane 132 (e.g., a diffraction plane corresponding to an angular distribution of light from the sample 106). Further, although not illustrated, the overlay metrology sub-system 102 may include multiple channels, each having a separate detector 118. In this way, the overlay metrology sub-system 102 may provide multiple simultaneous measurements using multiple detectors 118 at any combination of field planes 130 or pupil planes 132. For example, the overlay metrology sub-system 102 may include one or more beamsplitters 124 (e.g., non-polarizing beamsplitters, polarizing beamsplitters, dichroic mirrors providing spectral selectivity, or the like) to split the measurement light 114 into the different channels for detection. The overlay metrology sub-system 102 may further include optical components to modify the properties of the measurement light 114 within each channel such as, but not limited to, polarizers, polarization rotators, spectral filters, spatial filters, or pupil filters (e.g., beam blocks or apertures in a pupil plane to block or pass selected diffraction orders).

Some embodiments of the present disclosure are directed to providing recipes for configuring the overlay metrology sub-system 102 to facilitate an overlay measurement based on selected diffraction orders. A metrology recipe may include a set of parameters for controlling various aspects of an overlay measurement such as, but not limited to, the illumination of a sample 106, the collection of light from the sample 106, or the position of the sample 106 during a measurement. In this way, the overlay metrology sub-system 102 may be configured to provide a selected type of measurement for a selected overlay target design. For example, a metrology recipe may include parameters of the illumination beam 108 such as, but not limited to, an illumination wavelength, an illumination pupil distribution (e.g., a distribution of illumination angles and associated intensities of illumination at those angles), a polarization of incident illumination, or a spatial distribution of illumination. By way of another example, a metrology recipe may include collection parameters such as, but not limited to, a collection pupil distribution (e.g., a desired distribution of angular light from the overlay target 104 to be used for a measurement and associated filtered intensities at those angles), collection field stop settings to select portions of the overlay target 104 of interest, polarization of collected light, wavelength filters, or parameters for controlling one or more detectors. By way of another example, a metrology recipe may include various parameters associated with a design of the overlay target 104 such as, but not limited to, positions and orientations of sample features (e.g., pitches of grating features along particular directions). By way of a further example, a metrology recipe may include various parameters associated with the position of the sample 106 during a measurement such as, but not limited to, a sample height, a sample orientation, whether a sample 106 is static during a measurement, or whether a sample 106 is in motion during a measurement (along with associated parameters describing the speed, scan pattern, or the like).

In this way, the overlay metrology sub-system 102 may be configurable according to a metrology recipe to provide a selected distribution of light in a collection pupil when analyzing a particular overlay target 104 with a known design. This distribution of light in the collection pupil may then be further modified by various optics as desired to produce a desired overlay measurement.

In some embodiments, the overlay metrology system 100 further includes a controller 134 with one or more processors 136 configured to execute program instructions maintained on memory 138 (e.g., a memory medium). The controller 134 may be communicatively coupled with any of the components of the overlay metrology system 100 such as, but not limited to the detector 118. In this way, the controller 134 may generate overlay measurements based on the detection signals in accordance with the metrology recipe. The overlay measurements may then be used for various purposes including, but not limited to, generating correctibles for controlling an exposure tool, calculating overlay corrections, or the like.

The one or more processors 136 of a controller 134 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 136 may include any device configured to execute algorithms and/or instructions (e.g., program instructions stored in memory). In one embodiment, the one or more processors 136 may be embodied as a desktop computer, mainframe computer system, workstation, image computer, parallel processor, networked computer, or any other computer system configured to execute a program configured to operate or operate in conjunction with the overlay metrology system 100, as described throughout the present disclosure Moreover, different subsystems of the overlay metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller 134 or, alternatively, multiple controllers. Additionally, the controller 134 may include one or more controllers housed in a common housing or within multiple housings. In this way, any controller or combination of controllers may be separately packaged as a module suitable for integration into the overlay metrology system 100.

The memory 138 may include any storage medium known in the art suitable for storing program instructions executable by the associated one or more processors 136. For example, the memory 138 may include a non-transitory memory medium. By way of another example, the memory 138 may include, but is not limited to, a read-only memory (ROM), a random-access memory (RAM), a magnetic or optical memory device (e.g., disk), a magnetic tape, a solid-state drive and the like. It is further noted that memory 138 may be housed in a common controller housing with the one or more processors 136. In one embodiment, the memory 138 may be located remotely with respect to the physical location of the one or more processors 136 and controller 134. For instance, the one or more processors 136 of the controller 134 may access a remote memory (e.g., server), accessible through a network (e.g., internet, intranet and the like).

Referring now generally to FIGS. 2A-5, overlay metrology with shared sensitivity metrics is described in greater detail, in accordance with one or more embodiments of the present disclosure. It is noted that FIGS. 2A-5 depict the use of first-order SCOL techniques; however, this is solely for illustrative purposes and should not be interpreted as limiting. In particular, the systems and methods disclosed herein may be extended to other SCOL techniques (e.g., zero-order SCOL techniques) and such techniques are within the spirit and scope of the present disclosure.

Further, each cell 202 should be designed such that it would be 180-degree rotationally symmetric (e.g., invariant to 180-degree rotations) when there is no overlay error (OVL=0) and the intended offset is zero ($f_0=0$). It is noted that this condition does not imply that the intended offsets be zero. Rather, the first-layer printed elements 204 and the second-layer printed elements 208 may be designed to satisfy 180-degree rotational symmetry under these conditions. In practice, the two cells 202 have equal and opposite non-zero intended offsets as depicted in FIG. 3A. For example, a first cell 202 may have an intended offset of $+f_0$ and a second cell 202 may have an intended offset of $-_0$.

In this configuration, the overlay target 104 is invariant under:

$$\begin{bmatrix} f_0 \\ k_x, k_y \\ OVL \end{bmatrix} \to \begin{bmatrix} -f_0 \\ -k_x, -k_y \\ -OVL \end{bmatrix}, \tag{1}$$

where $k_x$, $k_y$ represent pupil coordinates. In this way, rotating a cell 202 having an intended offset $f_0$ printed with an unintended actual overlay OVL provides an opposite induced offset and actual overlay ($f_0 \to -f_0$ and $OVL \to -OVL$) and further provides that the resulting pupil-plane distribution of light collected from the cells 202 is rotated by 180 degrees ($k_x, k_y \to -k_x, -k_y$).

In the case of first-order SCOL in which cells 202 include grating-over-grating structures, metrology data associated from a particular cell 202 having an intended offset of $f_0$ may include a signal associated with positive first-order diffraction $$\left(I_{+1}^{f_0}\right)$$

and a signal associated with negative first-order diffraction $$\left(I_{-1}^{f_0}\right).$$

The metrology data from such an overlay target 104 may thus include a signal associated with positive first-order diffraction from the first cell 202

$$\left(I_{+1}^{+f_0}\right),$$

signal associated with negative first-order diffraction from the first cell 202

$$\left(I_{-1}^{+f_0}\right),$$

a signal associated with positive first-order diffraction from the second cell 202

$$\left(I_{+1}^{-f_0}\right),$$

and a signal associated with negative first-order diffraction from the second cell 202

$$\left(I_{-1}^{-f_0}\right),$$

Further, when the overlay target 104 is illuminated by illumination that also possesses a 180-degree rotational symmetry, then the collected signals will obey $$I_{+1}^{+f_0}(OVL) = I_{-1}^{-f_0}(-OVL). \tag{2}$$

Expanding the metrology data in series in overlay (OVL) and intended offset ($f_0$) to a linear order, the 180-degree symmetry of each cell 202 as well as the illumination provides that:

$$I_{+1}^{+f_0} = A\cdot\cos\left(2\pi\frac{OVL+f_0}{P}\right) + B\cdot\sin\left(2\pi\frac{OVL+f_0}{P}\right), \tag{3}$$

$$I_{-1}^{+f_0} = A\cdot\cos\left(2\pi\frac{OVL+f_0}{P}\right) - B\cdot\sin\left(2\pi\frac{OVL+f_0}{P}\right), \tag{4}$$

$$I_{+1}^{-f_0} = A\cdot\cos\left(2\pi\frac{OVL-f_0}{P}\right) + B\cdot\sin\left(2\pi\frac{OVL-f_0}{P}\right), \text{ and} \tag{5}$$

$$I_{-1}^{-f_0} = A\cdot\cos\left(2\pi\frac{OVL-f_0}{P}\right) - B\cdot\sin\left(2\pi\frac{OVL-f_0}{P}\right), \tag{6}$$

where P is the pitch of the first-layer printed elements 204 and the second-layer printed elements 208.

When OVL, $f_0$»P, Equations (3)-(6) reduce to:

$$I_{+1}^{+f_0} = A + B\cdot(OVL+f_0), \tag{7}$$

$$I_{-1}^{+f_0} = A - B\cdot(OVL+f_0), \tag{8}$$

$$I_{+1}^{-f_0} = A + B\cdot(OVL-f_0), \text{ and} \tag{9}$$

$$I_{-1}^{-f_0} = A - B\cdot(OVL+f_0), \tag{10}$$

where A and B are constants.

The metrology data (e.g., the signals described by Equations (3)-(10) may generally be collected in a field plane 130 (e.g., a plane conjugate to the sample 106) or a pupil plane 132 (e.g., a diffraction plane).

Figure 4:
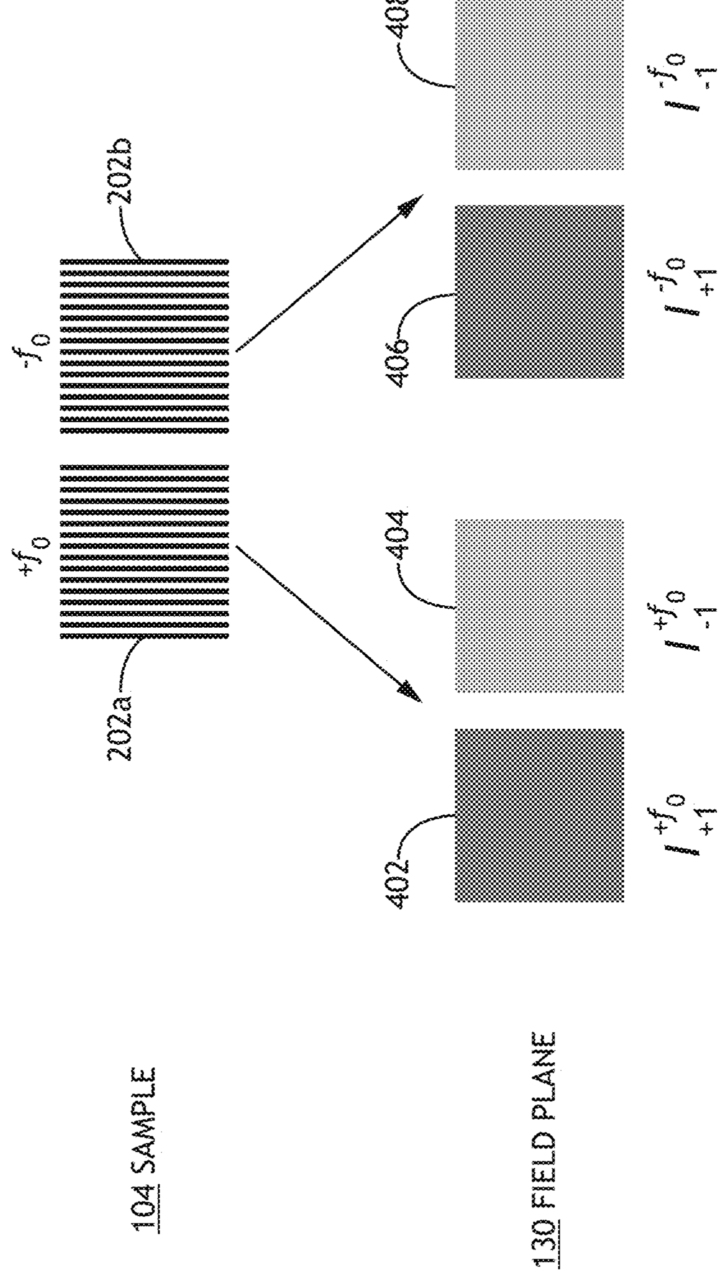
FIG. 4 is a conceptual illustration of metrology data associated with first-order diffraction captured in a field plane, in accordance with one or more embodiments of the present disclosure.

FIG. 4 is a conceptual illustration of metrology data associated with first-order diffraction captured in a field plane 130, in accordance with one or more embodiments of the present disclosure. A field-plane image of a cell 202 (e.g., with a periodic structure such as a grating-over-grating structure) generated using a single diffraction order may generally have a uniform intensity across the entire cell 202 that is dependent on the interference between the first-layer printed elements 204 and the second-layer printed elements 208. In this configuration, an overlay measurement may be based on the relative intensities of the various cells 202 based on different diffraction orders. As an illustration, FIG. 4 depicts a first field-plane image 402 and a second field-plane image 404 based on diffraction orders from a first cell 202*a* of an overlay target 104 with an intended offset of $+f_0$ associated with positive first-order diffraction $$\left(I_{+1}^{+f_0}\right)$$

and negative first-order diffraction $$\left(I_{-1}^{+f_0}\right),$$

respectively. These images may be captured simultaneously in different channels of the overlay metrology sub-system 102 or sequentially in a common channel. FIG. 4 also depicts a third field-plane image 406 and a fourth field-plane image 408 based on diffraction orders from a second cell 202*b* of an overlay target 104 with an intended offset of $-f_0$ associated with positive first-order diffraction $$\left(I_{+1}^{-f_0}\right)$$

and negative first-order diffraction $$\left(I_{-1}^{-f_0}\right),$$

respectively. Similarly, these images may be captured simultaneously in different channels of the overlay metrology sub-system 102 or sequentially in a common channel.

Figure 5:
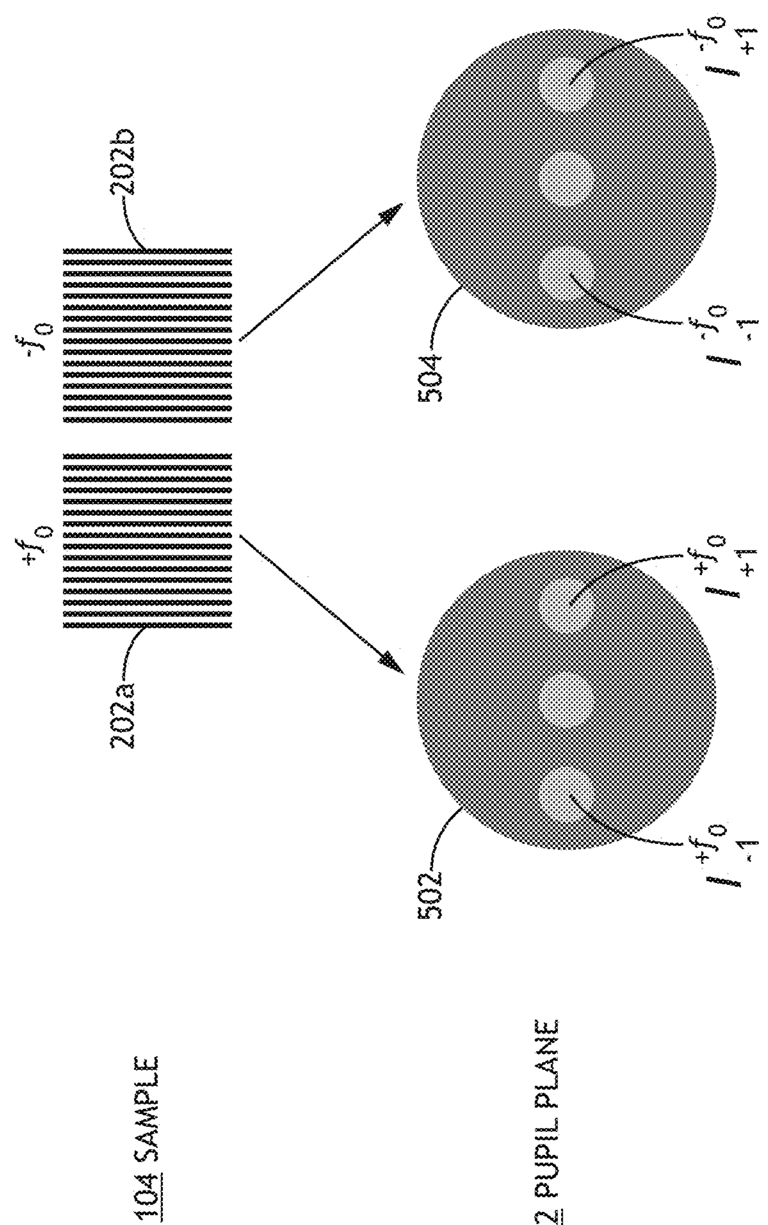
FIG. 5 is a conceptual illustration of metrology data associated with first-order diffraction captured in a pupil plane, in accordance with one or more embodiments of the present disclosure.
Figure 5:

FIG. 5 is a conceptual illustration of metrology data associated with first-order diffraction captured in a pupil plane 132, in accordance with one or more embodiments of the present disclosure. A first pupil distribution 502 (e.g., distribution of light in a pupil plane 132) depicts diffraction lobes from a first cell 202*a* of an overlay target 104 with an intended offset of $+f_0$ associated with positive first-order diffraction $$\left(I_{+1}^{+f_0}\right)$$

and negative first-order diffraction $$\left(I_{-1}^{+f_0}\right).$$

A second pupil distribution 504 depicts diffraction lobes from a second cell 202*b* of the overlay target 104 with an intended offset of $-f_0$ associated with positive first-order diffraction $$\left(I_{+1}^{-f_0}\right)$$

and negative first-order diffraction $\left(I_{-1}^{-f_0}\right)$.

It is noted that these four metrology data signals $$\left(I_{+1}^{+f_0}, I_{-1}^{+f_0}, I_{+1}^{-f_0}, \text{ and } I_{-1}^{-f_0}\right)$$

may be captured using any suitable techniques. For example, the metrology data signals $$I_{+1}^{+f_0}$$

and $$I_{-1}^{+f_0}$$

in the first pupil distribution 502 may be captured as a first measurement, while the metrology data signals $$I_{+1}^{-f_0}$$

and $$I_{-1}^{-f_0}$$

in the second pupil distribution 504 may be captured as a second measurement.

Regardless of the collection technique, an overlay measurement may be generated based on the metrology data using a variety of techniques or formulations, all of which are within the spirit and scope of the present disclosure.

As an illustration, Equations (11)-(16) illustrate a common non-limiting technique for generating an overlay measurement from such metrology data based on the generation of differential signals.

For example, the following differential signals may be defined:

$$D^{+f_0} = \frac{I_{+1}^{+f_0} - I_{-1}^{+f_0}}{2} = B \cdot \sin\left(2\pi \frac{OVL + f_0}{P}\right) \tag{11}$$

$$D^{-f_0} = \frac{I_{+1}^{-f_0} - I_{-1}^{-f_0}}{2} = B \cdot \sin\left(2\pi \frac{OVL - f_0}{P}\right). \tag{12}$$

These differential signals may then be combined into so-called K and G signals:

$$K = \frac{D^{+f_0} + D^{-f_0}}{2} = B\sin\left(2\pi \frac{OVL}{P}\right)\cos\left(2\pi \frac{f_0}{P}\right) \tag{13}$$

$$G = \frac{D^{+f_0} + D^{-f_0}}{2f_0} = B\cos\left(2\pi \frac{OVL}{P}\right)\sin\left(2\pi \frac{f_0}{P}\right) \tag{14}$$

An overlay measurement (OVL) may then be generated as $$OVL = \frac{P}{2\pi}\tan^{-1}\left(\frac{K}{G}\tan\left(2\pi \frac{f_0}{P}\right)\right) \tag{15}$$

as long as G≠0.

Assuming OVL«P, Equation (13) and (14) indicate that the K signal is dependent on the actual value of the overlay OVL being measured at the location of the overlay target 104, while the G signal is not. Rather, the G signal depends on $$\left(\frac{OVL}{P}\right)^2,$$

which is negligible under these conditions. In this case, Equation 15 reduces to $$OVL = \frac{K}{G}. \tag{16}$$

The G signal may be associated with properties of the overlay target 104 itself and may be representative of a sensitivity of the particular overlay target 104 to overlay variations. Put another way, the G signal may represent the linear response of measured metrology data to changes in overlay. For these reasons, the G signal may be referred to as a sensitivity metric.

It is to be understood that the G signal as described in Equations (11)-(16) is one non-limiting example of a sensitivity metric and that any suitable sensitivity metric is within the spirit and scope of the present disclosure. In this way, the present disclosure is not limited to the particular definitions of the differential signals (e.g., Equations (11) and (12)), the K signal, or the G signal.

It is contemplated that a sensitivity metric such as, but not limited to, the G signal of Equation (14) may be dependent on various characteristics of the overlay target 104 itself and/or measurement conditions (e.g., parameters of a metrology recipe). For example, a sensitivity metric may be influenced by physical characteristics of the overlay target 104 such as, but not limited to, a height of the overlay target 104, heights of the first-layer printed elements 204 and the second-layer printed elements 208, thicknesses of any constituent materials, refractive indices of any constituent materials, pitches of the first-layer printed elements 204 and the second-layer printed elements 208, or the physical layout of the first-layer printed elements 204 and the second-layer printed elements 208 (e.g., bar over bar, trench, or the like). As another example, a sensitivity metric may be influenced by parameters of the illumination beam 108 such as, but not limited to, the wavelength or the incidence angle.

Such a sensitivity metric may thus be a function of location on the sample 106 (e.g., a function of sample coordinates). Further, such a sensitivity metric may generally vary with a similar length scale as variations of these underlying properties, typically vary much slower than the overlay across the sample 106 (e.g., the overlay signature). For example, the overlay signature may vary rapidly across each field and often with a repeating pattern in each field. In contrast, the sensitivity metric may vary more slowly within each field and also between fields.

As a result, sensitivity metrics measured on different overlay targets 104 in the same region of the sample 106 may be similar, even if the overlay targets 104 belong to different fields and/or the actual overlay at the respective locations is substantially different.

In embodiments of the present disclosure, sensitivity metrics are measured for a first set of overlay targets 104 (e.g., a subset of all overlay targets 104 on the sample 106) and then used to generate (e.g., estimate, model, or the like) sensitivity metrics at locations of a second set of overlay targets 104. For convenience of description, the first set of overlay targets 104 are referred to herein as calibration targets and the second set of overlay targets 104 are referred to herein as efficiency targets.

The systems and methods disclosed herein may provide numerous benefits over complete characterization of a set of calibration targets across a sample 106. For example, a reduced number of measurements of the efficiency targets may be needed to generate an overlay measurement since the sensitivity metrics are obtained from measurements of the calibration targets, which may substantially improve measurement efficiency. As another example, the efficiency targets may require fewer cells 202 than the calibration targets.

As an illustration, first-order SCOL techniques may require two cells 202 for the calibration targets (e.g., as depicted in FIG. 3A) and a single cell 202 for the efficiency targets (e.g., as depicted in FIG. 3B). For example, an efficiency target may include a single cell 202 without an intended offset (e.g., $f_0=0$). When the G signal taken from the calibration targets, the overlay (OVL) may be calculated as:

$$D^{f_0=0}=\frac{I_{+1}^{f_0=0}-I_{-1}^{f_0=0}}{2}=B\cdot OVL \text{ and} \tag{17}$$

$$OVL=\frac{D^{f_0=0}}{G}. \tag{18}$$

More generally, the overlay (OVL) for an efficiency target with a single cell 202 having a non-zero intended offset ($f_0\neq0$) may be calculated as:

$$\frac{D^{f_0\neq0}}{G}=\frac{I_{+1}^{f_0\neq0}-I_{-1}^{f_0\neq0}}{2G}=OVL+f_0. \tag{19}$$

Referring generally to FIGS. 3A-5 and Equations (2)-(19), references to first-order SCOL techniques are provided herein solely for illustrative purposes and should not be interpreted as limiting. Rather, the systems and methods disclosed herein may be extended to any suitable type of SCOL technique. As another illustration, zero-order SCOL techniques may require four cells 202 for the calibration targets and two cells 202 for the efficiency targets.

Figure 6:
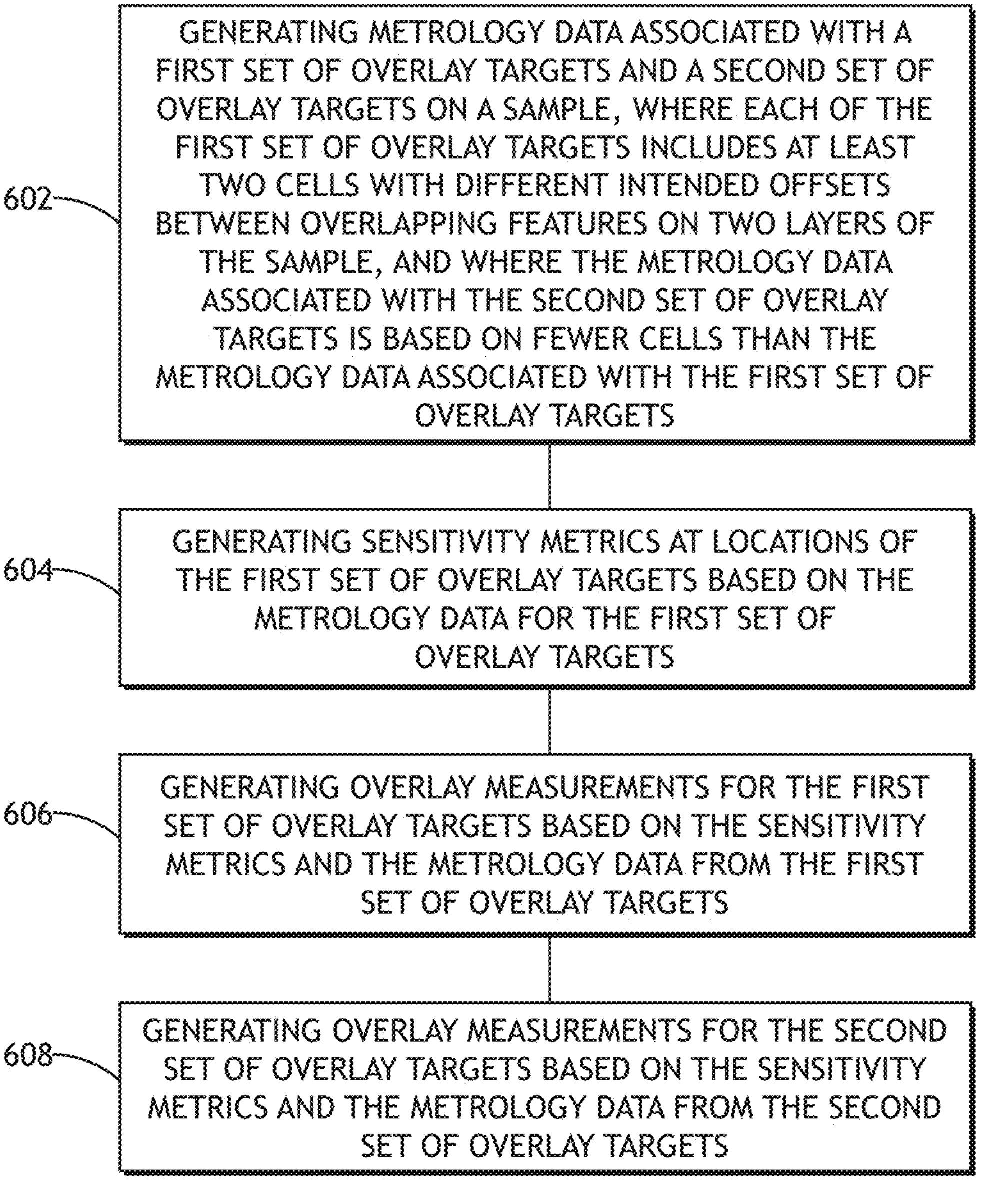
FIG. 6 is a flow diagram illustrating steps performed in a method for efficient scatterometry overlay metrology based on sensitivity calibration, in accordance with one or more embodiments of the present disclosure.

Referring now to FIG. 6, FIG. 6 is a flow diagram illustrating steps performed in a method 600 for efficient SCOL metrology based on sensitivity calibration, in accordance with one or more embodiments of the present disclosure. Applicant notes that the embodiments and enabling technologies described previously herein in the context of the overlay metrology system 100 should be interpreted to extend to the method 600. It is further noted, however, that the method 600 is not limited to the architecture of the overlay metrology system 100.

In embodiments, the method 600 includes a step 602 of generating metrology data associated with a first set of overlay targets 104 (e.g., calibration targets) and a second set of overlay targets 104 on a sample 106 (e.g., efficiency targets), where each of the first set of overlay targets 104 includes at least two cells 202 with different intended offsets between overlapping features on two layers of the sample 106, and where the metrology data associated with the second set of overlay targets 104 is based on fewer cells 202 than the metrology data associated with the first set of overlay targets 104. For example, the first set of overlay targets 104 may each include two grating-over-grating structures with different intended offsets (e.g., in different cells 202), whereas the second set of overlay targets 104 may each include a single grating-over-grating structure (e.g., as an overlay target 104 with a single cell 202). Further, such a single-cell overlay target 104 in the second set of overlay targets 104 may have, but is not required to have, no intended offset (e.g., $f_0=0$).

In embodiments, the method 600 includes a step 604 of generating sensitivity metrics at locations of the first set of overlay targets 104 based on the metrology data for the first set of overlay targets 104. In embodiments, the method 600 includes a step 606 of generating overlay measurements for the first set of overlay targets 104 based on the sensitivity metrics and the metrology data from the first set of overlay targets 104. In embodiments, the method 600 includes a step 608 of generating overlay measurements for the second set of overlay targets 104 based on the sensitivity metrics and the metrology data from the second set of overlay targets 104.

The calibration and efficiency targets may generally have any suitable design and/or number of cells 202 for a selected metrology measurement technique. For example, metrology data associated with the overlay targets 104 may generally be based on first-order diffraction for a first-order SCOL technique, zero-order signals (e.g., zero-order diffraction from the associated grating-over-grating structures or combinations of higher-order diffraction from the first-layer printed elements 204 and the second-layer printed elements 208 that emanate from the grating-over-grating structures in parallel with the zero-order diffraction, or the like) for a zero-order SCOL technique, or the like.

Any sensitivity metric suitable for the overlay targets 104 may be utilized in steps 606 and 608. For example, the sensitivity metric may be, but is not required to be, G signals as described by Equations (7)-(14).

Further, in some embodiments, the efficiency targets have fewer grating-over-grating structures (e.g., cells 202) than the calibration targets. For example, as described with respect to FIGS. 3A-3B and Equations (7)-(14), the calibration targets may have two grating-over-grating structures having different intended offsets (e.g., $\pm f_0\neq0$ or any other suitable offsets), whereas the efficiency targets may have a single grating-over-grating structure with zero or non-zero intended offsets.

As described previously herein, reducing a number of grating-over-grating structures (e.g., cells 202) of the efficiency targets may beneficially decrease the overall size of the targets and thus allow for more flexible placement of these targets. Although overlay targets 104 may generally be placed at any suitable location including scribe lines or dies, it is typically desirable to limit the number and/or size of overlay targets 104 within the dies. However, it may be the case that the reduced size of the efficiency targets may allow more flexibility for in-die placements. In some embodiments, a sample 106 includes one or more calibration targets within scribe lines and efficiency targets distributed in any combination of scribe lines or within dies.

In some embodiments, the calibration and efficiency targets have the same design (e.g., have a common number of grating-over-grating structures). In this configuration, metrology data may be generated (e.g., in step 602) for a subset of the grating-over-grating structures in the efficiency targets. This may allow for increased measurement efficiency of a wide variety of samples 106.

The calibration and efficiency targets may also have any suitable layout on the sample 106. In a general sense, the benefits of using efficiency targets are reduced the more calibration targets are needed. However, because the sensitivity metrics vary slowly across a sample 106 and may be continuous across fields, the sensitivity metrics of calibration targets in one field can be used to generate sensitivity metrics for use at locations of the efficiency targets in the same or different fields.

Figure 7:
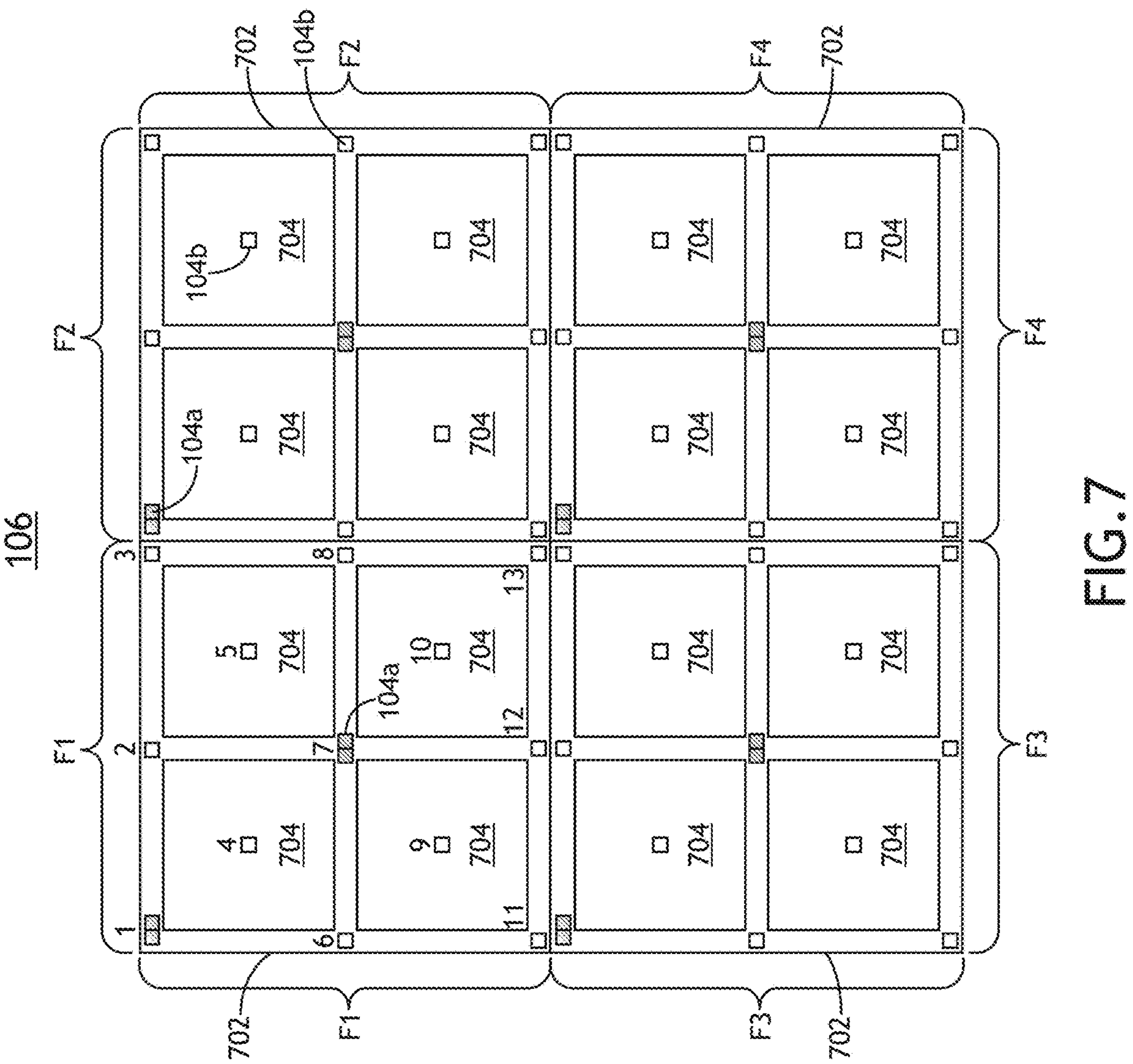
FIG. 7 is a simplified top view of a distribution of calibration and efficiency targets in four fields on a sample, in accordance with one or more embodiments of the present disclosure.

FIG. 7 is a simplified top view of a distribution of calibration and efficiency targets in four fields 702 on a sample 106, in accordance with one or more embodiments of the present disclosure. It is to be understood that the distribution of targets in FIG. 7 is provided solely for illustrative purposes and should not be interpreted as limiting. Rather, any distribution of calibration and efficiency targets is within the sprit and scope of the present disclosure.

FIG. 7 depicts four fields 702 labeled F1, F2, F3, and F4, each with four dies 704 and each with the same distribution of overlay targets 104 (labeled 1-13). In the non-limiting distribution of FIG. 7, the calibration targets 104*a* each include two cells 202 (e.g., two grating-over-grating structures) as depicted in FIG. 3A, while the efficiency targets 104*b* each include a single cell 202 (e.g., a single grating-over-grating structure). Each of the fields 702 include two calibration targets 104*a* (labeled 1 and 7 in F1) in scribe lines (e.g., areas between dies 704), where one is in a center of the field 702 and one is located in a corner. Each of the fields 702 also includes 11 efficiency targets 104*b* (labeled 2-7 and 8-13 in F1) distributed both within the dies 704 and in scribe lines (e.g., near corners of the dies 704). In this configuration, the maximum distance between a calibration target 104*a* and an efficiency target 104*b* is the length of one die 704.

Referring again generally to FIG. 6, the sensitivity metrics at locations of the efficiency targets may be calculated (e.g., in step 608) using any technique. In embodiments, the method 600 includes generating a model of the sensitivity metrics across the overlay metrology system 100 based on the metrology data of the calibration targets. For example, the sensitivity metrics at locations of the efficiency targets may be calculated based on interpolation, fitting (e.g., polynomial fitting), or nearest neighbor techniques.

It is contemplated herein that the technique for calculating the sensitivity metrics at locations of the efficiency targets may depend on the configuration of the overlay metrology sub-system 102 used to generate the metrology data (e.g., in step 602).

For example, when generating metrology data based on measurements in a field plane 130 (e.g., as depicted in FIG. 5), both the K and G signals are roughly constant within each cell 202, but may exhibit some variation due to edge effects or other irregularities. In this case, the G signal (or the sensitivity metric more generally) may be generated based on an average intensity, an intensity in a selected region of interest, or any suitable technique. The G signal (or the sensitivity metric more generally) may then be modeled across a sample 106 using any suitable technique including, but not limited to, interpolation, fitting (e.g., polynomial fitting), or a nearest neighbor technique.

As another example, when generating metrology data based on measurements in a pupil plane 132, the G signal varies across the pupil plane 132 and is thus a function of pupil coordinates. In this case, every region of the pupil plane 132 may have different G signal behavior across the sample 106. In some embodiments, a model of the G signal (or the sensitivity metric more generally) may be constructed per pixel across the pupil plane 132 and used to calculate sensitivity metrics at locations of the efficiency targets. In some embodiments, a nearest neighbor technique is used where the sensitivity metric at a location of a particular efficiency target is determined based on values at N nearest neighbor calibration targets (e.g., an average value of the N nearest neighbors or any suitable weighting scheme). In this technique, the value of N may be determined based on any factors including, but not limited to, a rate of change of the sensitivity metric across the sample 106, a density of calibration targets, or the like.

In some embodiments, the G signal is modeled by using a polynomial, splines or any other modeling method as a function of both pupil and wafer coordinates based on the measurements at the locations of the calibration targets. This model may then be used to provide the G signal at the locations of the efficiency targets.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology system comprising:

a controller communicatively coupled to a metrology sub-system, the metrology sub-system configured to illuminate a sample with an illumination beam and collect measurement light from the sample, the controller including one or more processors configured to implement a metrology recipe by executing program instructions causing the one or more processors to:

generate, via the metrology sub-system in accordance with the metrology recipe, metrology data associated with a first set of overlay targets, wherein each of the first set of overlay targets includes at least two cells with different intended offsets between overlapping features on two layers of a sample, wherein the metrology data associated with the first set of overlay targets is associated with separate pupil-plane measurements of intensities of two or more diffraction orders of the illumination beam by each of the at least two cells of the first set of overlay targets;

generate, via the metrology sub-system in accordance with the metrology recipe, metrology data associated with a second set of overlay targets, wherein the metrology data associated with the second set of overlay targets is based on fewer cells than the metrology data associated with the first set of overlay targets;

generate sensitivity metrics at locations of the first set of overlay targets based on the metrology data associated with the first set of overlay targets, wherein the sensitivity metrics are generated per pixel associated with the pupil plane of the metrology sub-system based on one or more difference signals associated with differences between the pupil-plane measurements of the intensities of the two or more diffraction orders of the illumination beam by each of the at least two cells of the first set of overlay targets;

determine sensitivity metrics at locations of the second set of overlay targets, wherein the sensitivity metric for a particular location of a particular one of the second set of overlay targets is generated based on N nearest overlay targets in the first set of overlay targets, wherein a value of N is determined based on at least one of a rate of change of the sensitivity metric across the sample or a density of the first set of overlay targets; and generate overlay measurements for the first set of overlay targets based on the metrology data associated with the first set of overlay targets; and generate overlay measurements for the second set of overlay targets based on the metrology data associated with the second set of overlay targets and the sensitivity metrics at the locations of the second set of overlay targets.

2. The metrology system of claim 1, wherein the cells of at least one of the first or second sets of overlay targets are 180-degree rotationally symmetric.

3. The metrology system of claim 1, wherein the first set overlay targets includes two cells with different intended offsets, wherein the second set of overlay targets includes a single cell.

4. The metrology system of claim 3, wherein the cells of the first and second sets of overlay targets include grating-over-grating structures, wherein the metrology data for the first and second sets of overlay targets includes first-order diffraction from the respective cells.

5. The metrology system of claim 1, wherein the first set overlay targets includes four cells with different intended offsets, wherein the second set of overlay targets includes two of the cells with different intended offsets.

6. The metrology system of claim 5, wherein the cells of the first and second sets of overlay targets include grating-over-grating structures, wherein the metrology data for the first and second sets of overlay targets includes zero-order light from the respective cells.

7. The metrology system of claim 1, wherein the first set overlay targets and the second set of overlay targets have a common number of cells, wherein the metrology data associated with the second set of overlay targets is based on a subset of the cells.

8. The metrology system of claim 1, wherein the generating the overlay measurements for the first and second sets of overlay targets based on the sensitivity metrics and the metrology data from the second set of overlay targets comprises:

calculating the sensitivity metrics at locations of the second set of overlay targets based on the sensitivity metrics at the locations of the first set of overlay targets.

9. The metrology system of claim 1, wherein the cells of the first and second sets of overlay targets include grating-over-grating structures, wherein constituent gratings of the grating-over-grating structures have a common pitch.

10. The metrology system of claim 9, wherein the metrology data associated with any of the grating-over-grating structures includes metrology data associated with positive first-order diffraction ($I_{+1}$) and negative first-order diffraction ($I_{-1}$).

11. The metrology system of claim 10, wherein the metrology data associated with the positive first-order diffraction ($I_{+1}$) and the negative first-order diffraction ($I_{-1}$) is captured in the pupil plane.

12. The metrology system of claim 1, wherein each of the first set of overlay targets includes a first grating-over-grating structure with a first intended offset ($f_1$) and a second grating-over-grating structure with a second intended offset ($f_2$), wherein the metrology data associated with each of the first set of overlay targets includes positive first-order diffraction $$\left(I_{+1}^{f_1}\right)$$

from the first grating-over-grating structure, negative first-order diffraction $$\left(I_{-1}^{f_1}\right)$$

from the first grating-over-grating structure, positive first-order diffraction $$\left(I_{+1}^{f_2}\right)$$

from the second grating-over-grating structure, and negative first-order diffraction $$\left(I_{-1}^{f_2}\right)$$

from the second grating-over-grating structure.

13. The metrology system of claim 12, wherein the first intended offset ($f_1$) and the second intended offset ($f_2$) have equal magnitudes and opposite directions such that $f_1=f_0$ and $f_2=-f_0$.

14. The metrology system of claim 13, wherein the sensitivity metric (G) for a particular one of the first set of overlay targets is calculated as $$G = \frac{D^{+f_0} - D^{-f_0}}{2f_0},$$

where $$D^{+f_0} = \frac{I_{+1}^{+f_0} - I_{-1}^{+f_0}}{2}$$

and $$D^{-f_0} = \frac{I_{+1}^{-f_0} - I_{-1}^{-f_0}}{2}$$

based on the metrology data associated with the particular one of the first set of overlay targets.

15. The metrology system of claim 14, wherein an overlay measurement (OVL) for the particular one of the first set of overlay targets is calculated as $$OVL = \frac{P}{2\pi}\tan^{-1}\left(\frac{K}{G}\tan\left(2\pi\frac{f_0}{P}\right)\right), \text{ where } K = \frac{D^{+f_0} + D^{-f_0}}{2}.$$

16. The metrology system of claim 1, wherein the sensitivity metrics are independent of physical overlay at the locations of the first set of overlay targets.

17. The metrology system of claim 16, wherein the sensitivity metrics correspond to a linear response of the metrology data in response to variations of the physical overlay at the locations of the first set of overlay targets.

18. The metrology system of claim 1, wherein the second set of overlay targets is larger than the first set of overlay targets.

19. The metrology system of claim 1, wherein the program instructions are further configured to cause the one or more processors to provide correctibles for controlling an exposure tool based on the overlay measurements for the first and second sets of overlay targets.

20. A metrology system comprising:

a metrology sub-system configured to generate metrology data associated with a sample, wherein the metrology sub-system is configured to illuminate a sample with at least one illumination beam from an illumination source and direct measurement light from the sample onto one or more detectors using one or more lenses; wherein the metrology sub-system is configured to implement a metrology recipe by:

generating metrology data associated with a first set of overlay targets, wherein each of the first set of overlay targets includes at least two cells with different intended offsets between overlapping features on two layers of the sample, wherein the metrology data associated with the first set of overlay targets is associated with separate pupil-plane measurements of intensities of two or more diffraction orders of the illumination beam by each of the at least two cells of the first set of overlay targets; and generating metrology data associated with a second set of overlay targets, wherein the metrology data associated with the second set of overlay targets is based on fewer cells than the metrology data associated with the first set of overlay targets; and a controller communicatively coupled to the metrology sub-system, the controller including one or more processors configured to execute program instructions causing the one or more processors to:

receive, from the metrology sub-system in accordance with the metrology recipe, metrology data associated with the first set of overlay targets;

receive metrology data associated with the second set of overlay targets;

generate sensitivity metrics at locations of the first set of overlay targets based on the metrology data associated with the first set of overlay targets, wherein the sensitivity metrics are generated per pixel associated with the pupil plane of the metrology sub-system based on one or more difference signals associated with differences between the pupil-plane measurements of the intensities of the two or more diffraction orders of the illumination beam by each of the at least two cells of the first set of overlay targets;

determine sensitivity metrics at locations of the second set of overlay targets, wherein the sensitivity metric for a particular location of a particular one of the second set of overlay targets is generated based on N nearest overlay targets in the first set of overlay targets, wherein a value of N is determined based on at least one of a rate of change of the sensitivity metric across the sample or a density of the first set of overlay targets;

generate overlay measurements for the first set of overlay targets based on the sensitivity metrics and the metrology data associated with the first set of overlay targets; and generate overlay measurements for the second set of overlay targets based on the metrology data associated with the second set of overlay targets and the sensitivity metrics at the locations of the second set of overlay targets.

21. The metrology system of claim 20, wherein the generating the overlay measurements for the first and second sets of overlay targets based on the sensitivity metrics and the metrology data from the second set of overlay targets comprises:

calculating the sensitivity metrics at locations of the second set of overlay targets based on the sensitivity metrics at the locations of the first set of overlay targets.

22. The metrology system of claim 20, wherein the cells of the first and second sets of overlay targets include grating-over-grating structures, wherein the grating-over-grating structures have a common pitch.

23. The metrology system of claim 22, wherein the metrology data associated with any of the grating-over-grating structures includes data associated with positive first-order diffraction ($I_{+1}$) and negative first-order diffraction ($I_{-1}$).

24. The metrology system of claim 23, wherein the metrology data associated with the positive first-order diffraction ($I_{+1}$) and the negative first-order diffraction ($I_{-1}$) is resolved in the pupil plane.

25. The metrology system of claim 20, wherein the program instructions are further configured to cause the one or more processors to provide correctibles for controlling an exposure tool based on the overlay measurements for the first and second sets of overlay targets.

26. A method comprising:

generating, with a metrology sub-system in accordance with a metrology recipe, metrology data associated with a first set of overlay targets and a second set of overlay targets on a sample, wherein each of the first set of overlay targets includes at least two cells with different intended offsets between overlapping features on two layers of the sample, wherein the metrology data associated with the first set of overlay targets is associated with separate pupil-plane measurements of intensities of two or more diffraction orders of the illumination beam by each of the at least two cells of the first set of overlay targets, wherein the metrology data associated with the second set of overlay targets is based on fewer cells than the metrology data associated with the first set of overlay targets;

generating sensitivity metrics at locations of the first set of overlay targets based on the metrology data associated with the first set of overlay targets, wherein the sensitivity metrics are generated per pixel associated with the pupil plane of the metrology sub-system based on one or more difference signals associated with differences between the pupil-plane measurements of the intensities of the two or more diffraction orders of the illumination beam by each of the at least two cells of the first set of overlay targets;

determining sensitivity metrics at locations of the second set of overlay targets, wherein the sensitivity metric for a particular location of a particular one of the second set of overlay targets is generated based on N nearest overlay targets in the first set of overlay targets, wherein a value of N is determined based on at least one of a rate of change of the sensitivity metric across the sample or a density of the first set of overlay targets;

generating overlay measurements for the first set of overlay targets based on the sensitivity metrics and the metrology data associated with the first set of overlay targets; and generating overlay measurements for the second set of overlay targets based on the metrology data associated with the second set of overlay targets and the sensitivity metrics at the locations of the second set of overlay targets.

27. The metrology method of claim 26, further comprising:

providing correctibles for controlling an exposure tool based on the overlay measurements for the first and second sets of overlay targets.

28. A sample comprising:

a plurality of overlay targets distributed across a plurality of fields, wherein the plurality of overlay targets comprises:

a first set of overlay targets, wherein each of the first set of overlay targets includes at least two cells with different intended offsets between overlapping features on two layers of the sample; and a second set of overlay targets, wherein each of the second set of overlay targets includes fewer cells than the first set of overlay targets wherein the first set of overlay targets and the second set of overlay targets are distributed across the sample such that a sensitivity metric for a particular location of a particular one of the second set of overlay targets is determinable based on N nearest overlay targets in the first set of overlay targets, wherein a value of N is based on at least one of a rate of change of the sensitivity metric across the sample or a density of the first set of overlay targets;

wherein a distribution of the first set of overlay targets and the second set of overlay targets is configured to provide that overlay measurements for the second set of overlay targets are determinable based on metrology data associated with the second set of overlay targets and sensitivity metrics generated per pixel associated with a pupil plane of a metrology sub-system based on metrology data associated with separate pupil-plane measurements of intensities by the metrology sub-system of two or more diffraction orders of an illumination beam by the first set of overlay targets provides overlay measurements at locations of the first set of overlay targets; and wherein metrology data associated with diffraction by the second set of overlay targets and sensitivity metrics from the metrology data associated with the first set of overlay targets provides overlay measurements at locations of the second set of overlay targets, wherein the sensitivity metrics are generated per pixel associated with a pupil plane of a metrology sub-system based on metrology data associated with separate pupil-plane measurements of intensities by the metrology sub-system of two or more diffraction orders of an illumination beam by the first set of overlay targets provides overlay measurements at locations of the first set of overlay targets.

* * * * *